United States Patent
Mazzola et al.

(10) Patent No.: US 7,084,003 B2
(45) Date of Patent: Aug. 1, 2006

(54) METHOD FOR MANUFACTURING SEMICONDUCTOR DEVICE PACKAGES

(75) Inventors: Mauro Mazzola, Calvenzano (IT); Renato Poinelli, Casatenovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 444 days.

(21) Appl. No.: 10/313,962

(22) Filed: Dec. 6, 2002

(65) Prior Publication Data

US 2003/0134452 A1 Jul. 17, 2003

(30) Foreign Application Priority Data

Dec. 6, 2001 (EP) .............................. 01830748

(51) Int. Cl.
- H01L 21/44 (2006.01)
- H01L 21/48 (2006.01)
- H01L 21/50 (2006.01)

(52) U.S. Cl. ..................... 438/106; 438/111; 438/112; 438/123; 438/124; 438/127

(58) Field of Classification Search ................. 438/112, 438/122
See application file for complete search history.

(56) References Cited

U.S. PATENT DOCUMENTS

| | | | |
|---|---|---|---|
| 3,930,114 A | 12/1975 | Hodge | 174/52 FP |
| 5,430,331 A * | 7/1995 | Hamzehdoost et al. | 257/796 |
| 5,698,899 A * | 12/1997 | Hirakawa et al. | 257/712 |
| 5,808,359 A * | 9/1998 | Muto et al. | 257/712 |
| 5,904,506 A * | 5/1999 | Yoneda et al. | 438/124 |
| 6,258,630 B1 * | 7/2001 | Kawahara | 438/122 |

FOREIGN PATENT DOCUMENTS

| | | |
|---|---|---|
| EP | 0782184 | 7/1997 |
| EP | 0786807 | 7/1997 |
| JP | 04162655 | 6/1992 |
| JP | 200012740 | 1/2000 |

* cited by examiner

*Primary Examiner*—Michael Lebentritt
*Assistant Examiner*—Angel Roman
(74) *Attorney, Agent, or Firm*—Lisa K. Jorgenson; Allen, Dyer, Doppelt, Milbrath & Gilchrist, P.A.

(57) ABSTRACT

A method for encapsulating an electronic device is provided. The electronic device includes an integrated circuit, a lead frame for supporting the integrated circuit and having peripheral leads integrally formed therewith, and a heat sink thermally coupled to the lead frame. The heat sink includes an extension extending therefrom in a direction towards a corner of the electronic device. The method includes positioning the electronic device within a mold that includes a gate therein that is adjacent to and parallel with the extension. Molten insulative material is injected through the gate and into the mold for encapsulating the integrated circuit, and at least a portion of the lead frame and the heat sink.

10 Claims, 3 Drawing Sheets

METHOD FOR MANUFACTURING SEMICONDUCTOR DEVICE PACKAGES

FIELD OF APPLICATION

The present invention relates to electronic devices, and in particular, to a method for encapsulating a semiconductor electronic device.

BACKGROUND OF THE INVENTION

Semiconductor electronic devices comprise an electronic circuit formed on a small plate of semiconductor material, known as a die, having a surface area of a few square millimeters. The electronic circuit is typically monolithically integrated with the die. The die is then enclosed in a case or package for heat and mechanical protection. Plastic packages will be specifically considered herein.

These type devices require suitable support and electrical interconnection arrangements for their electrical connection to an external circuit. For this purpose, a lead frame is cut from a thin metal plate to include a plurality of narrow strips forming electrical connectors or leads having one end connected electrically to the integrated circuit by conductive wires. The wires are soldered between the leads and corresponding terminations within the integrated circuit. The other or free ends of the leads extend from the plastic package to provide electrical connection pins for the device.

Since certain new generation devices may require over 100 leads for as many pins, the metal strips have to be made very thin and, therefore, are easily distorted. To prevent this problem, a dam bar is provided to link the frame leads together.

The power integrated circuits discussed below are commonly referred to as power packages, and are likely to release relatively large amounts of heat. A power package denotes a device that is adapted to dissipate heat. In this case, the die would be thermally coupled to a heat sink element for transferring the heat generated during its operation to the outside environment.

The heat sink element is made of metal, or another good heat conductor, in the form of a cylinder or a flattened parallelepiped having a much larger mass than the electronic device. As is typical in a power package, the heat sink element has only one of its major surfaces exposed. The other major surface and all the lateral surfaces of the heat sink element are isolated since they are covered under the material from which the plastic package is formed.

In some devices, the heat sink element has at least one of its sides laterally exposed from the plastic package. FIG. 1 is a bottom view of an electronic device 1 after the plastic package 2 has been molded around it. The plastic package 2 encapsulates a heat sink element 3 while leaving only a major bottom surface 4 of the latter exposed. This surface is flush with the underside of the plastic package.

A frame 5 is mounted on the opposite surface of the heat sink element 3 from the surface 4, and is affixed thereto by riveting or soldering. The frame 5 is partly embedded in the plastic package 2 such that the ends of the leads 6 externally project from the plastic package 2. A dam bar 8 is provided to link the leads 6 together.

In this prior art device, the heat sink element 3 has two extensions 7, the ends of which project out through opposite sides of the plastic package 2. In particular, the extensions 7 in this type of device are centrally located on two opposed sides of the frame 5. Leads 6 are not formed corresponding to the extensions 7.

The standard process steps for molding a conventional plastic package with an exposed heat sink will now be reviewed. Integrated circuits, complete with their heat sinks, are introduced into a mold having cavities aligned with the individual devices for molding their respective plastic package. Each cavity is injected with a molten electrically insulative material at a high temperature. This material is typically a synthetic resin, e.g., an epoxy resin, for forming the plastic package.

To arrange for the heat sink element 3 to have an exposed surface, the mold is formed at the peripheral portions or extensions with cavities, in which plastic blocks or tips 7a are molded. These tips 7a will abut the exposed portions of the extensions 7 in the finished package.

The molding process itself comprises injecting the resin into the cavity through a gate 9, as best shown in FIG. 2, to form the plastic package and the plastic tips 7a. For the device shown in FIG. 2, the injection gate 9 would be provided in the mold at one corner of the device.

The molding process continues through steps to be carried out within the mold, namely melting the plastic material, expanding the melt inside the mold, and solidifying the melt. After an initial cooling step, followed by thermal curing processes to thoroughly polymerize the resin, the plastic package is completely formed. The series of plastic packages are ready for removal from the mold.

The plastic tips 7a are then removed from the finished plastic packages to uncover the portions of the extensions 7 that are to be exposed. Although advantageous in several aspects, this method has several drawbacks. New power devices require a larger number of pins for connection to the outside environment. Thus, the lateral regions of the plastic packages must be left unobstructed, such that the leads can be provided all around the peripheral surface of the package.

SUMMARY OF THE INVENTION

An object of the present invention is to provide a method for manufacturing plastic packages for electronic devices having exposed heat sinks while overcoming limitations of the prior art manufacturing methods.

This and other objects, advantages and features in accordance with the present invention are provided by a method of manufacturing a protective case for encapsulating a power device having an exposed heat sink and a large number of leads, wherein the resin injection space is optimized based upon a modified frame structure.

In particular, the electronic device may comprise an integrated circuit, a lead frame for supporting the integrated circuit and comprising a plurality of peripheral leads, and a heat sink thermally coupled to the lead frame and comprising at least one extension extending in a direction towards a corner of the electronic device. The method preferably comprises positioning the electronic device within a mold that includes a gate therein that is adjacent to and parallel with the at least one extension. A molten insulative material is injected through the gate and into the mold for encapsulating the integrated circuit and a portion of the lead frame and the heat sink.

Another aspect of the present invention is directed to a mold for encapsulating an electronic device as defined above. The mold preferably comprises a top half mold and a bottom half mold. At least one of the top and bottom half molds may further includes at least one cavity at the at least one extension of the lead frame, and a gate that is adjacent to the at least one extension. The gate receives a molten insulative material.

Yet another aspect of the present invention is directed to an electronic device comprising an integrated circuit, a lead frame for supporting the integrated circuit and comprising a plurality of peripheral leads, and a heat sink thermally coupled to the lead frame and comprising at least one extension extending in a direction towards a corner of the electronic device. The lead frame preferably comprises a dam bar for holding the plurality of leads together, and has a notch adjacent the at least one extension. A package encapsulates the integrated circuit and at least a portion of the lead frame and the heat sink.

BRIEF DESCRIPTION OF THE DRAWINGS

The features and advantages of the method according to the present invention will become apparent from the following detailed description of an embodiment thereof, given by way of a non-limited example with reference to the accompanying drawings.

DETAILED DESCRIPTION OF THE PREFERRED EMBODIMENTS

Figure 1:
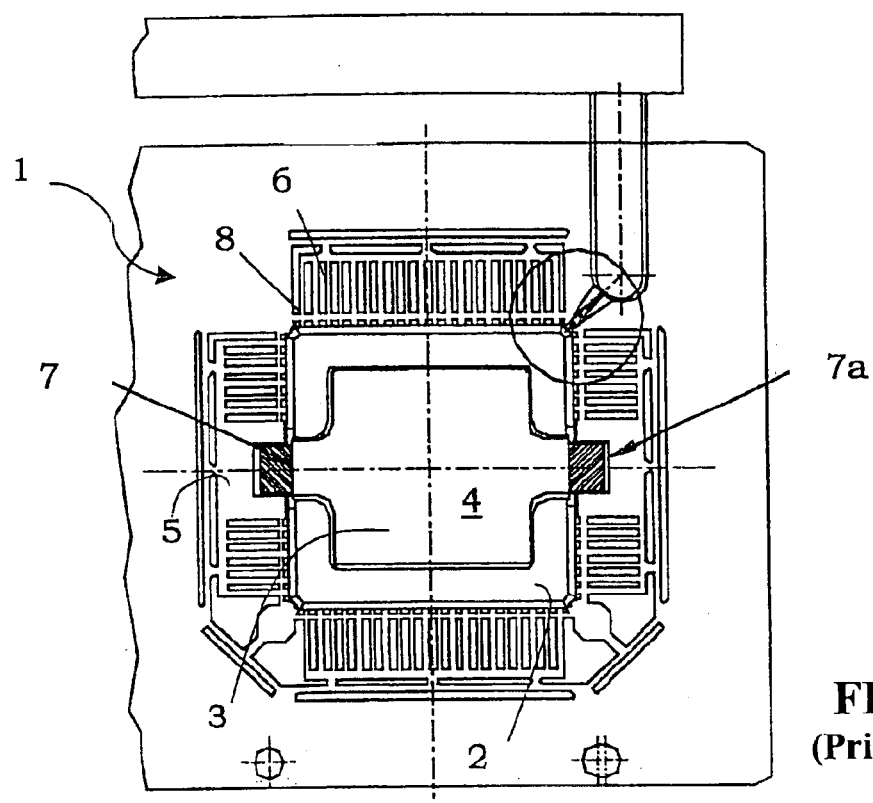
FIG. 1 is a bottom plan view of an electronic device during a molding step for forming the plastic package using a molding technique according to the prior art.
Figure 2:
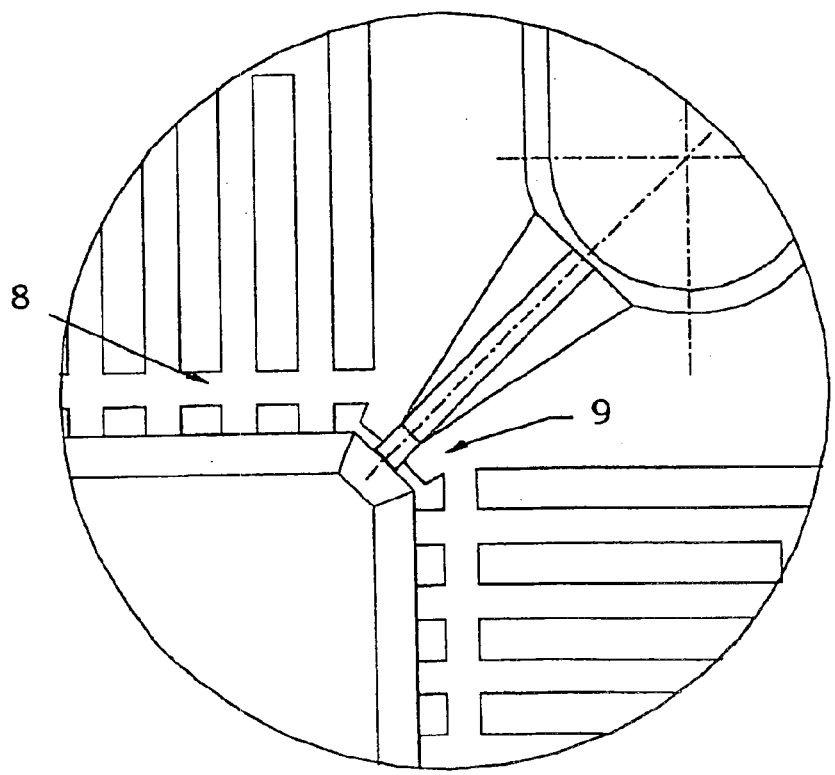
FIG. 2 is an enlarged view of a portion of the electronic device shown in FIG. 1.
Figure 3:
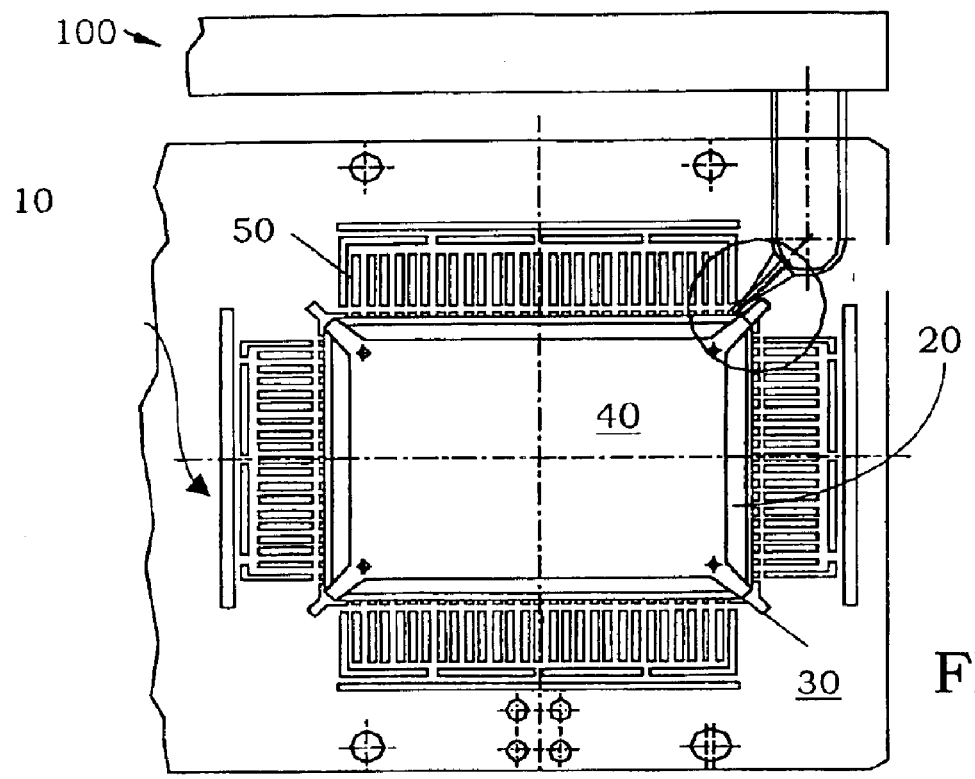
FIG. 3 is a bottom plan view of an electronic device during a molding step for forming the plastic package using a molding process according to the present invention.
Figure 4:
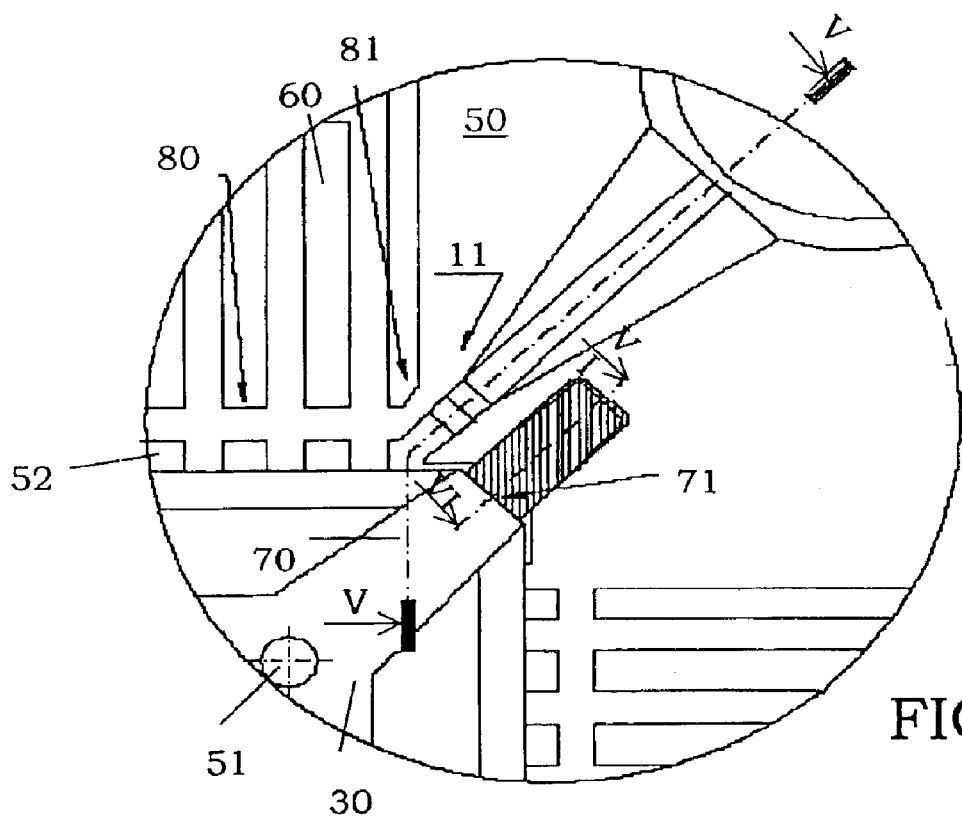
FIG. 4 is an enlarged view of a portion of the electronic device shown in FIG. 3.

A method for manufacturing a plastic package according to the present invention will now be described with reference to FIGS. 3 to 6. In particular, FIGS. 3 and 4 are bottom plan views of an electronic device 10 after the plastic package 20 has been molded. Embedded in the plastic package 20 is a heat sink element 30 with its bottom surface 40 being exposed flush with the underside of the package.

A lead frame 50 is then attached to the heat sink element 30 on the opposite end from the surface 40 using fastening means, such as rivets or solder 51. The frame 50 is partly embedded in the plastic package 20 so that the ends of the leads, shown at 60, project outside of the plastic package 20. A dam bar 80 is provided to link the leads 60 together.

In particular, the lead frame 50 includes an outer frame 52 surrounding a die (not shown). The outer frame 52 carries four sets of inward leads connected to the die, and four sets of outward leads for connection to outer terminals. The outward set is connected to the inward set by the dam bar 80. The dam bar 80 provides support for holding the leads in place during the device assembling process.

The heat sink element 30, which may be rectangular in shape, has four extensions 70 extending substantially from the four corners of the plastic package 20. The extensions 70 each have an end surface 71 extending from the plastic package 20.

Figure 5:
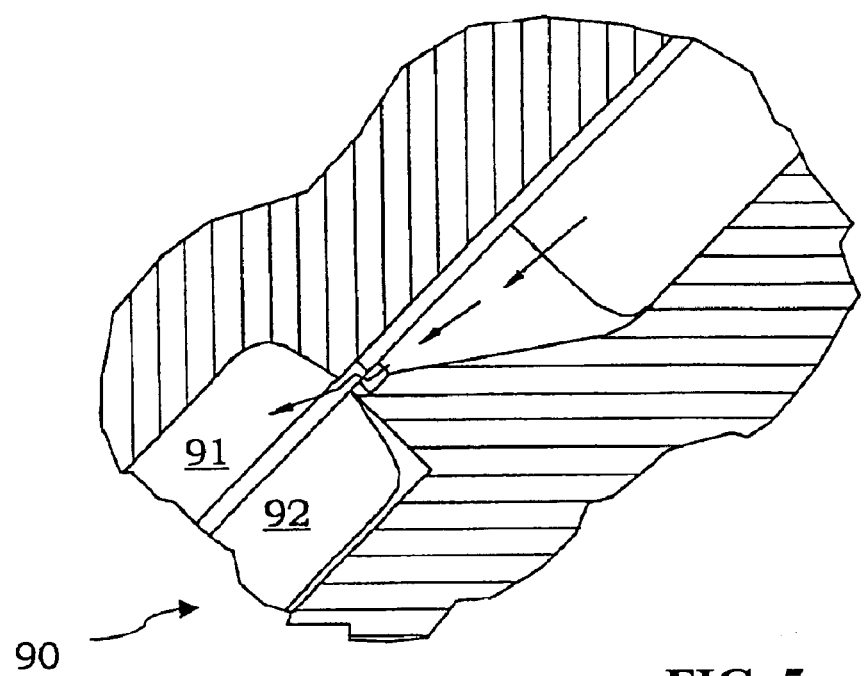
FIG. 5 is a sectional view of the electronic device shown in FIG. 4 taken along line V—V.
Figure 6:
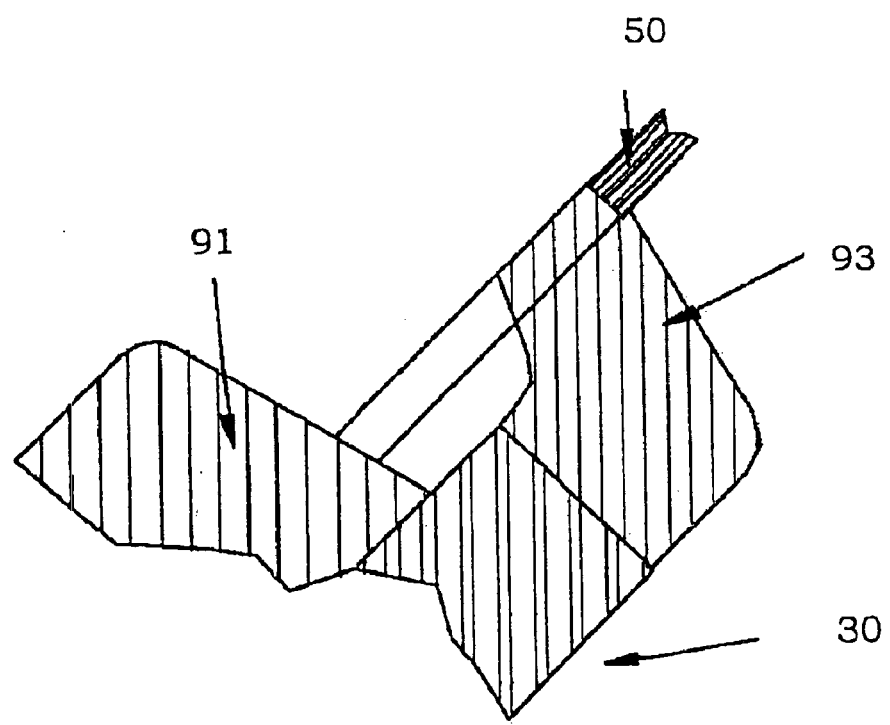
FIG. 6 is a sectional view of the electronic device shown in FIG. 4 taken along line VI—VI.

The method of molding plastic packages according to the invention will now be described. In particular, FIG. 5 is a vertical cross-sectional view of a mold defining a single cavity. Although in conventional molding processes, the mold would include a number of adjacent cavities for simultaneously molding a plurality of packages.

A resin injection mold is denoted generally by 90. In the embodiment shown in FIGS. 5 and 6, the mold comprises a top half mold 91 and a bottom half mold 92. The top and bottom half molds are provided with recesses facing each other. The top and bottom half molds are closed to define a single molding cavity into which the resin will be injected.

The plastic package 20 for encapsulating the frame 50, together with the die and the heat sink element 30, allows a major surface 40 of the heat sink element 30 and the end surfaces 71 of the extensions 70 to be exposed. For this purpose, the heat sink element 30 should be in contact with the bottom half mold 92. In addition, the bottom half mold 92 should be formed with cavities 93 at the locations of the extensions 70. These cavities 93 should be located at the frame corners.

After the frame 50 is positioned in the mold and the mold closed, a filler, such as an epoxy resin, is injected into the mold 90. The resin is injected in a molten state through a runner 100 formed in the bottom half mold 92. The runner narrows in the direction toward an inlet for forming a mold gate 11.

According to the invention, the frame 50 is designed to have the gate 11 located adjacent to one of the molding cavities 93 formed at the extensions 70 of the heat sink element 30. In particular, the gate 11 and the runner 100 for conveying the resin into the molding cavity are located between a cavity 93 and an adjacent lead 60. For this purpose, the dam bar 80 is formed with a lead-in notch 81 to admit the resin into the mold 90. In particular, the dam bar 80 is cut to slope to one side of the frame 50.

In other words, the centerline of the gate 11 lies substantially parallel to a diagonal line of the frame, but offset therefrom. Its position is selected to enable the resin to fill even the most remote regions of the mold cavity from the gate 11.

The resin inflow to the mold advantageously goes through the frame 50 between the cavities 93 and the adjacent leads 60. In summary, the method of the present invention achieves the following: fabrication of power packages with a large number of pins and heat sinks located at the corners of the plastic packages; a reduced risk of fractures occurring in the corner areas of the plastic packages; straightforward frame designs; and straightforward molding insert designs.

That which is claimed is:

1. A method for encapsulating an electronic device comprising an integrated circuit; a lead frame for supporting the integrated circuit and comprising a plurality of peripheral leads, and a dam bar for holding the plurality of leads, the dam bar having a notch therein; and a heat sink thermally coupled to the lead frame and comprising at least one extension adjacent the notch in the dam bar and extending in a direction towards a corner of the electronic device, the method comprising:

positioning the electronic device within a mold that includes a gate therein that is adjacent to and substantially parallel with the at least one extension and the notch in the dam bar; and injecting a molten insulative material through the gate and into the mold for encapsulating the integrated circuit, and at least a portion of the lead frame and the heat sink.

2. A method according to claim 1 wherein the insulative material comprises plastic.

3. A method according to claim 1, wherein the notch is substantially parallel to a centerline of the gate.

4. A method according to claim 1, wherein the mold includes a runner for directing the molten insulative material to the gate, with the runner being constricted at the gate.

5. A method according to claim 1, wherein the at least one extension has an exposed end surface after the electronic device has been encapsulated.

6. A method for encapsulating an electronic device comprising an integrated circuit; a lead frame for supporting the integrated circuit and comprising a plurality of peripheral leads, and a dam bar for holding the plurality of peripheral leads together, the dam bar having a notch therein; and a heat sink thermally coupled to the lead frame and comprising at least one extension extending in a direction towards a corner of the electronic device, the method comprising:

positioning the electronic device within a mold that includes a gate therein that is adjacent to the at least one extension and is adjacent to the notch in the dam bar, a centerline of the gate being substantially parallel with a diagonal line of the lead frame, but offset therefrom; and injecting an encapsulating material through the gate and into the mold for encapsulating the integrated circuit, and at least a portion of the lead frame and the heat sink.

7. A method according to claim 6, wherein the encapsulating material comprises plastic.

8. A method according to claim 6, wherein the notch is substantially parallel to a centerline of the gate.

9. A method according to claim 6, wherein the mold includes a runner for directing the encapsulating material to the gate, with the runner being constricted at the gate.

10. A method according to claim 6, wherein the at least one extension has an exposed end surface after the electronic device has been encapsulated.

* * * * *